(12) United States Patent
Yagyu et al.

(10) Patent No.: US 8,698,268 B2
(45) Date of Patent: Apr. 15, 2014

(54) AVALANCHE PHOTODIODE AND METHOD FOR MANUFACTURING THE AVALANCHE PHOTODIODE

(75) Inventors: Eiji Yagyu, Chiyoda-ku (JP); Eitaro Ishimura, Chiyoda-ku (JP); Masaharu Nakaji, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/160,286

(22) Filed: Jun. 14, 2011

(65) Prior Publication Data

US 2011/0241070 A1    Oct. 6, 2011

Related U.S. Application Data

(62) Division of application No. 11/914,871, filed as application No. PCT/JP2005/009087 on May 18, 2005, now abandoned.

(51) Int. Cl.
*H01L 31/107* (2006.01)

(52) U.S. Cl.
USPC ............... 257/438; 257/186; 257/E31.063; 257/E31.116

(58) Field of Classification Search
USPC ............... 257/186, 438, E31.063, E31.116
See application file for complete search history.

(56) References Cited

U.S. PATENT DOCUMENTS

| 4,794,439 | A | * | 12/1988 | Webb et al. ............... 257/12 |
| 5,448,099 | A |   | 9/1995  | Yano |
| 5,552,629 | A |   | 9/1996  | Watanabe |
| 5,654,578 | A | * | 8/1997  | Watanabe ............... 257/438 |
| 5,937,274 | A | * | 8/1999  | Kondow et al. ............... 438/47 |
| 6,104,047 | A | * | 8/2000  | Watanabe ............... 257/186 |
| 6,229,162 | B1|   | 5/2001  | Watanabe |
| 6,635,908 | B2|   | 10/2003 | Tanaka et al. |

(Continued)

FOREIGN PATENT DOCUMENTS

| JP | 03 053565 | 3/1991 |
| JP | 4-332178 | 11/1992 |

(Continued)

OTHER PUBLICATIONS

Office Action issued May 10, 2011, in Japanese Patent Application No. 2007-516165 (with English-language Translation).

(Continued)

*Primary Examiner* — Robert Huber
(74) *Attorney, Agent, or Firm* — Oblon, Spivak, McClelland, Maier & Neustadt, L.L.P.

(57) ABSTRACT

An avalanche photodiode including a first electrode; and a substrate including a first semiconductor layer of a first conduction type electrically connected to the first electrode, in which at least an avalanche multiplication layer, a light absorption layer, and a second semiconductor layer of a second conduction type with a larger band gap than the light absorption layer are deposited on the substrate. The second semiconductor layer is separated into inner and outer regions by a groove formed therein, the inner region electrically connected to a second. With the configuration, the avalanche photodiode has a low dark current and high long-term reliability. In addition, the outer region includes an outer trench, and at least the light absorption layer is removed by the outer trench to form a side face of the light absorption layer. With the configuration, the dark current can be further reduced.

9 Claims, 8 Drawing Sheets

(56) References Cited

U.S. PATENT DOCUMENTS

| | | |
|---|---|---|
| 6,664,573 B2 | 12/2003 | Kim et al. |
| 6,800,914 B2 * | 10/2004 | Ito et al. ............... 257/438 |
| 7,049,640 B2 | 5/2006 | Boisvert et al. |
| 7,259,408 B2 | 8/2007 | Yagyu et al. |
| 7,462,889 B2 | 12/2008 | Yagyu et al. |
| 2002/0185702 A1 | 12/2002 | Shirai et al. |
| 2006/0226343 A1 | 10/2006 | Ko |
| 2008/0121867 A1 | 5/2008 | Yagyu et al. |

FOREIGN PATENT DOCUMENTS

| | | |
|---|---|---|
| JP | 05 175541 | 7/1993 |
| JP | 6-314813 | 11/1994 |
| JP | 7 312442 | 11/1995 |
| JP | 11 330530 | 11/1999 |
| JP | 2000 323746 | 11/2000 |
| JP | 2001 177143 | 6/2001 |
| JP | 2002-324911 | 11/2002 |
| JP | 2003 110133 | 4/2003 |
| JP | 2004-200302 | 7/2004 |
| JP | 2005 116681 | 4/2005 |
| WO | WO 2004/100224 A2 | 11/2004 |

OTHER PUBLICATIONS

Japanese Office Action drafted Dec. 21, 2011 in Patent Application No. 2007-516165 (with English-language translation).

* cited by examiner ature as an avalanche photodiode cannot be demonstrated. Thus, for example, a measure such that a high-resistance guard ring is provided by injecting impurities into the edge part is taken (for example, Patent Document 2).

AVALANCHE PHOTODIODE AND METHOD FOR MANUFACTURING THE AVALANCHE PHOTODIODE

CROSS-REFERENCE TO RELATED APPLICATIONS

This application is a divisional of U.S. Ser. No. 11/914,871 filed Mar. 11, 2008, the entire content of which is incorporated herein by reference. U.S. Ser. No. 11/914,871 is a National Stage Application of PCT/JP05/09087 filed May 18, 2005.

TECHNICAL FIELD

This invention relates to a light receiving element using a semiconductor and in particular to an avalanche photodiode with low dark current and high reliability for the long term.

BACKGROUND ART

An avalanche photodiode, which is used for optical communications or the like, is a semiconductor light receiving element including, in addition to a layer for performing photoelectric conversion, a layer for performing avalanche multiplication of photoelectric converted carriers, which achieves enhanced light reception sensitivity; it is required for the avalanche photodiode to have a low dark current property and high reliability.

Most of the avalanche photodiodes are formed of a compound semiconductor and can be roughly classified into a mesa structure and a planar structure according to its structure. The mesa structure is a structure in which a mesa is formed on a substrate and a pn junction is contained in the mesa. However, a breakdown easily occurs on the surface of the mesa periphery. In general, in order to suppress the breakdown, it is designed to suppress the dark current at law level by employing a structure formed with a slope and a structure in which a buried layer as a high resistance part is provided in the mesa outer peripheral region (for example, Patent Document 1).

The planar structure is a structure in which a pn junction is formed by providing a selective diffusion region, but an edge breakdown in the edge part of the pn junction introduces a problem. When a current flows in the edge part, if voltage is increased, the reverse voltage of the pn junction of a light reception section positioned at the center scarcely increases and thus the function as an avalanche photodiode cannot be demonstrated. Thus, for example, a measure such that a high-resistance guard ring is provided by injecting impurities into the edge part is taken (for example, Patent Document 2).

Patent Document 1: JP-A-2002-324911 (FIG. 1)
Patent Document 2: JP-A-7-312442 (pages 4-6, FIGS. 2 and 6)

DISCLOSURE OF THE INVENTION

Problems to be Solved by the Invention

However, the avalanche photodiodes in the related arts involve the following problems.

In the sloped type mesa structure, to provide a buried layer in the mesa outer peripheral region, for example, a process of partial and uniform crystal regrowth independent of the crystal plane by a metal organic chemical vapor deposition method (MO-CVD) or the like, is required and thus the manufacturing cost is risen and yield becomes poor. In addition, although a measure to lower the dark current is taken, there is also a problem of insufficient suppression effect.

In the planar structure (which is described as pseudo planar structure in Patent Document 2), for example, in a method of compensating for the p conduction type of a field relaxation layer in a light reception region peripheral portion and forming a guard ring, a trench must be formed for conducting ion implantation of Ti, etc. and the activation of the implanted ion is required, and an etching stopper layer needs to be provided. Further an impurity diffusion layer is provided on the outer periphery and thus the process becomes complicated and the manufacturing cost rises and the yield becomes poor. Since the electric field strength of the guard ring in a light absorption layer becomes high, the tunnel dark current increases.

The invention is conceived for solving the problems and it is an object of the invention to provide an avalanche photodiode that can be manufactured in a simple process, can suppress dark current, and ensures long-term reliability.

Means for Solving the Problems

An avalanche photodiode according to the invention includes a first electrode; and a substrate including a first semiconductor layer made of a first conduction type electrically connected to the first electrode, wherein at least an avalanche multiplication layer, a light absorption layer, and a second semiconductor layer made of a second conduction type with a larger band gap than the light absorption layer are deposited on the substrate, wherein the second semiconductor layer is separated into an inner region and an outer region by a groove formed therein, and wherein the inner region is electrically connected to a second electrode.

Advantages of the Invention

According to the invention, there can be provided an avalanche photodiode with low dark current and high long-term reliability in a simple process.

DESCRIPTION OF REFERENCE NUMERALS

1 Substrate, 2 First semiconductor layer, 3 Etching stopper layer, 4 Avalanche multiplication layer, 5 Field relaxation layer, 6 Light absorption layer, 7 Transition layer, 8 Second semiconductor layer, 9 Contact layer, 10 Groove, 11 Depletion region, 12 Protective film, 13 First electrode, 14 Second electrode, 21 Reflection prevention film, 15 Third semiconductor layer, 23 Multilayer reflection layer, 24 Reflection adjustment layer, 25 Side face, 26 Outer trench, 27 Cleavage plane, 28 Light, 81 First window layer, 82 Second window layer, 83 First cap layer, 84 Second cap layer, 110 Inner region, 111 Outer region

BEST MODE FOR CARRYING OUT THE INVENTION

First embodiment

Figure 1:
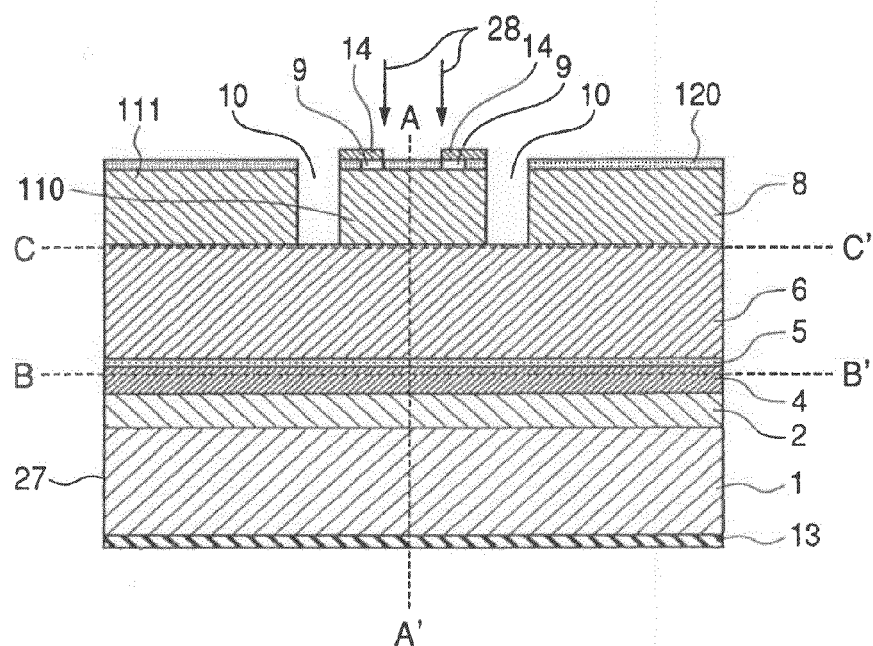
FIG. 1 is a sectional view to show the schematic structure of an avalanche photodiode according to a first embodiment of the invention.

FIG. 1 is a sectional view to show the schematic structure of an avalanche photodiode according to a first embodiment of the invention. Here, n type is used as a first conduction type, p type is used as a second conduction type, an n electrode is used as a first electrode, and a p electrode is used as a second electrode. Each semiconductor layer can be manufactured using MO-CVD, a molecular beam epitaxy (MBE), etc., on a wafer-like substrate 1 of n type InP, etc., for example. In the embodiment, the semiconductor layers are manufactured according to the following step order: A first semiconductor layer 2 (which will be hereinafter referred to as buffer layer) of n type InP, etc., at a carrier density of 0.2 to $2 \times 10^{19}$ cm$^{-3}$ is grown to a thickness of 0.1 to 1 µm, an avalanche multiplication layer 4 of i type AlInAs is grown to a thickness of 0.15 to 0.4 µm, a field relaxation layer 5 of p type InP at a carrier density of 0.5 to $1 \times 10^{18}$ cm$^{-3}$ is grown to a thickness of 0.03 to 0.06 µm, a light absorption layer 6 of p$^-$ type GaInAs at a carrier density of 1 to $5 \times 10^{15}$ cm$^{-3}$ is grown to a thickness of 1 to 1.5 µm, a second semiconductor layer 8 p type InP is grown to a thickness of 1 to 2 µm, and a contact layer 9 of p type GaInAs is grown to a thickness of 0.1 to 0.5 µm in order on the substrate 1. Here, detected light is incident from the opposite side to the substrate 1 (which will be hereinafter referred to as surface incidence) and thus the band gap of the second semiconductor layer 8 is made larger than energy of the detected light. The second semiconductor layer 8 allows detected light to pass through and therefore will be hereinafter referred to as window layer.

Next, an SiOx film is formed as a mask, and the center and the external part are etched out so that the contact layer 9 is left like a ring having an inner diameter of 20 µm and a width of 5 to 10 µm. Next, the SiNx film is removed, and thereafter an SiOx film is formed as a mask, and then the groove 10 with a ring shape having a width of 5 mm is formed by removing at least the second semiconductor layer 8, thereby being divided into an inner region 110 and an outer region 111. Further, an SiNx surface protective film and concurrently reflection prevention film 120 is formed by evaporation and the SiNx surface protective film and concurrently reflection prevention film 120 on the contact layer 9 is removed and a p electrode 14 is formed of AuZn/Au on the contact layer 9. Further, the face of the substrate 1 opposite to the deposition layer of the buffer layer 2 is ground and an n electrode 13 is formed of AuGe/Au and the buffer layer 2 is electrically connected to the n electrode 13. Further, cleavage separation of the wafer-like substrate 1 is performed to form an element about 300 µm square having a cleavage plane 27.

The operation of the avalanche photodiode manufactured in the process described above will be discussed below: Light 28 is made incident from the p electrode 14 side in a state in which a reverse bias voltage is applied from the outside so that the n electrode 13 side becomes plus and the p electrode 14 side becomes minus. For example, if light in a near infrared region of a 1.3 µm band or a 1.5 µm band of a optical communication waveband is made incident on the inside of the ring of the contact layer 9, the light passes through the window layer 8 with large band gap and is absorbed in the light absorption layer 6 to generate an electron-hole pair and the electron moves to the n electrode 13 side and the hole moves to the p electrode 14 side. When the reverse bias voltage is sufficiently high, in the avalanche multiplication layer 4, the electron is ionized to generate a new electron-hole pair and causes further ionization together with the newly generated electron and hole, whereby avalanche multiplication of multiplying the electrons and the holes like an avalanche is caused.

Figure 2:
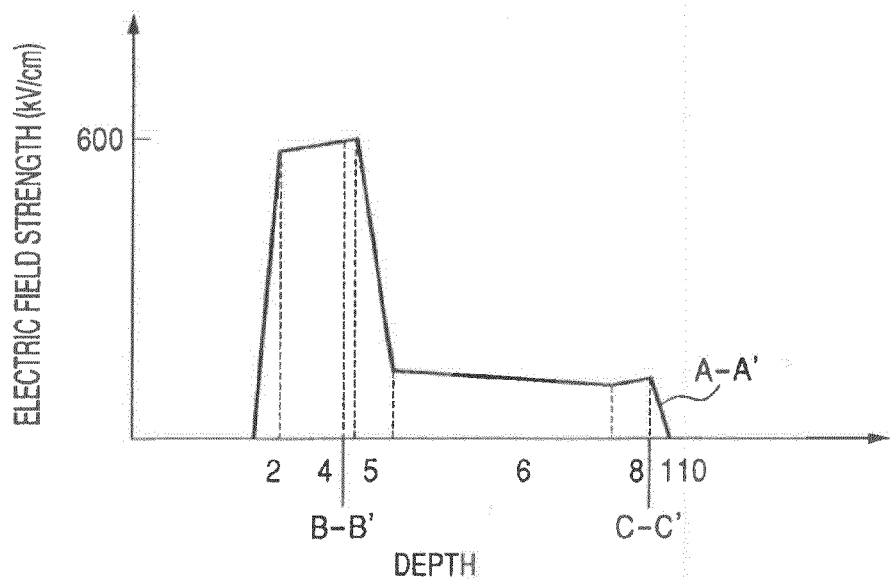
FIG. 2 is a characteristic drawing to represent an electric field strength distribution in the depth direction in a section taken on line A-A' in FIG. 1 according to the first embodiment of the invention.
Figure 3:
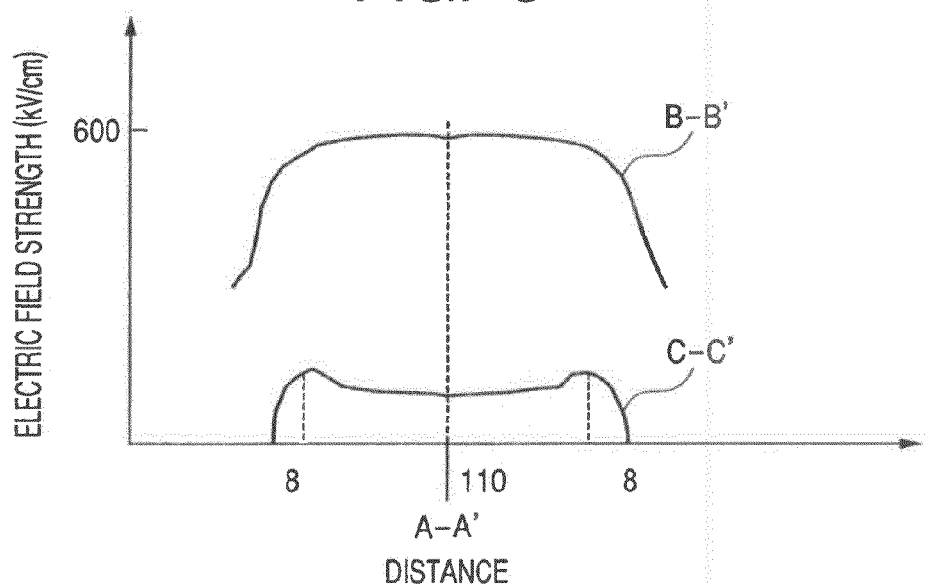
FIG. 3 is a characteristic drawing to represent an electric field strength distribution in the plane direction in a section taken on line B-B' and a section taken on line C-C' in FIG. 1 according to the first embodiment of the invention.

Next, the electric field strength in the avalanche photodiode of the embodiment shown in FIG. 1 will be discussed. FIG. 2 is a characteristic drawing to represent an electric field strength distribution in the depth direction in a section taken on line A-A' in FIG. 1, and FIG. 3 is a characteristic drawing to represent an electric field strength distribution in the plane direction in a section taken on line B-B' and a section taken on line C-C' in FIG. 1. The symbols on the horizontal axes of FIGS. 2 and 3 denote the formed semiconductor layers described above and in the figures, the A-A' section is represented as A-A', the B-B' section is represented as B-B', and the C-C' section is represented as C-C'. As shown in FIG. 2, the portion of the highest electric field becomes the avalanche multiplication layer 4. Further, as shown in the electric field strength distribution in the B-B' section in FIG. 3, the light reception region center just below the inner region 110 becomes the highest region and the electric field strength lessens as the region is closer to the peripheral portion. As shown in the electric field strength distribution in the C-C' section in FIG. 3, the electric field strength in the peripheral portion of the inner region 110 becomes higher than the center, but is lower than the electric field strength applied to the avalanche multiplication layer 4 as compared with the electric field strength distribution in the B-B' section in FIG. 2, so that the current amplification in the peripheral portion known as edge breakdown and the occurrence of current known as tunnel breakdown can be suppressed and the avalanche photodiode can be functioned as an avalanche photodiode.

Therefore, the avalanche photodiode according to the embodiment need not be provided with a structure called a guard ring for suppressing an edge breakdown, and an avalanche photodiode having a low dark current and high reliability can be easily realized.

In the embodiment, the field relaxation layer 5 is formed of p type InP by way of example, but may be formed of AlInAs. The field relaxation layer 5 is formed of p type InP by way of example, but may be formed of AlInAs. The field relaxation layer 5 may also be omitted depending on the situation, for example, by forming the avalanche multiplexing layer 4 of p type. The contact layer 9 for electrically connecting the inner region 110 and the p electrode 14 is provided by way of example, but the inner region 110 and the p electrode 14 may be brought into direct contact with each other.

When a transition layer 7 (not shown) made, e.g., of i type GaInAsP or AlGaInAs of about 0.02-0.2 μm is provided between the window layer 8 and the light absorption layer 6, the discontinuous amount of the valence band between the window layer 8 and the light absorption layer 6 is suppressed, and the flow of the hole can be enhanced from the light absorption layer 6 (at this time, serving as a hole transition layer). Therefore, pile-up of holes at a hetero interface can be prevented, and a higher-speed light response can be realized.

As a method for forming the groove 10 of this embodiment, in order to etch the InP semiconductor layer, the following method can be adopted: for example, a reactive ion etching or a wet etching using hydrochloric acid based solutions such as mixed solution of hydrochloric acid and phosphoric acid. Further, in order to etch a GaInAs semiconductor layer or an AlInAs semiconductor layer, the following solutions can be used: for example, an organic acid solution made by mixing a hydrogen peroxide solution and organic acid such as citric acid or tartaric acid; or a sulfuric acid solution made by mixing sulfuric acid and a hydrogen peroxide solution.

Second Embodiment

Figure 4:
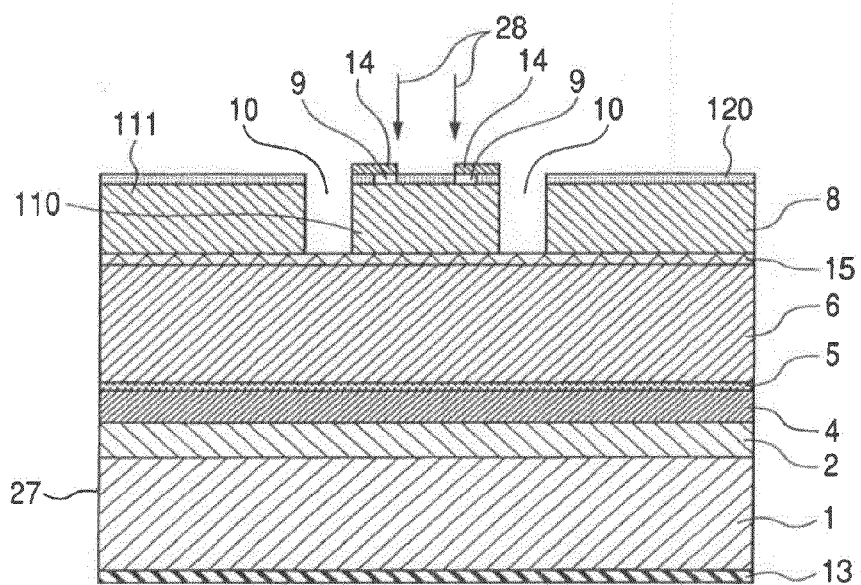
FIG. 4 is a sectional view to show the schematic structure of an avalanche photodiode according to a second embodiment of the invention.

FIG. 4 is a sectional view to show a schematic structure of an avalanche photodiode according to a second embodiment of the invention. In the present embodiment, in the avalanche photodiode according to the first Embodiment, a third semiconductor layer 15 with a larger band than the light absorption layer 6 and formed of i type InP having about 0.03 μm is provided between the light absorption layer 6 and the second semiconductor layer 8, and a groove 10 is formed by leaving the third semiconductor layer 15.

According to the present embodiment, the lower portion of the groove 10 exposed to the outside can be formed with a larger band gap than the light absorption layer 6. Therefore, it is possible to achieve suppression of surface deterioration in the lower portion of the groove 10, suppression of deterioration in dark current characteristics, and improvement in durability. In addition, the region in which electric field strength thereof is partially high in the periphery of the light reception region can be formed with a larger band gap than the light absorption layer 6. Therefore, it is possible to suppress the amplification of current in the periphery known as the edge breakdown and to suppress the occurrence of current known as the tunnel breakdown.

In the present embodiment, i type InP is used as the third semiconductor layer 15 by way of example, but i type AlInAs, i type AlGaInAs, and the like may be used. Since it is possible to perform a selective etching due to difference in an etching rate by using materials different from composition of the window layer 8, the groove 10 having a desired depth can be formed with high reliability. In this case, it is possible to serve as a hole transition layer as well.

In the present embodiment, i type is used as the third semiconductor layer 15 by way of example, but the third semiconductor layer 15 may have a larger band gap that the light absorption layer 6 and may not be the second conduction type. Therefore, a semi-insulating type may be used.

In the present embodiment, the third semiconductor layer 15 is formed of one layer by way of example, but may be formed of a plurality of layers.

Third Embodiment

Figure 5:
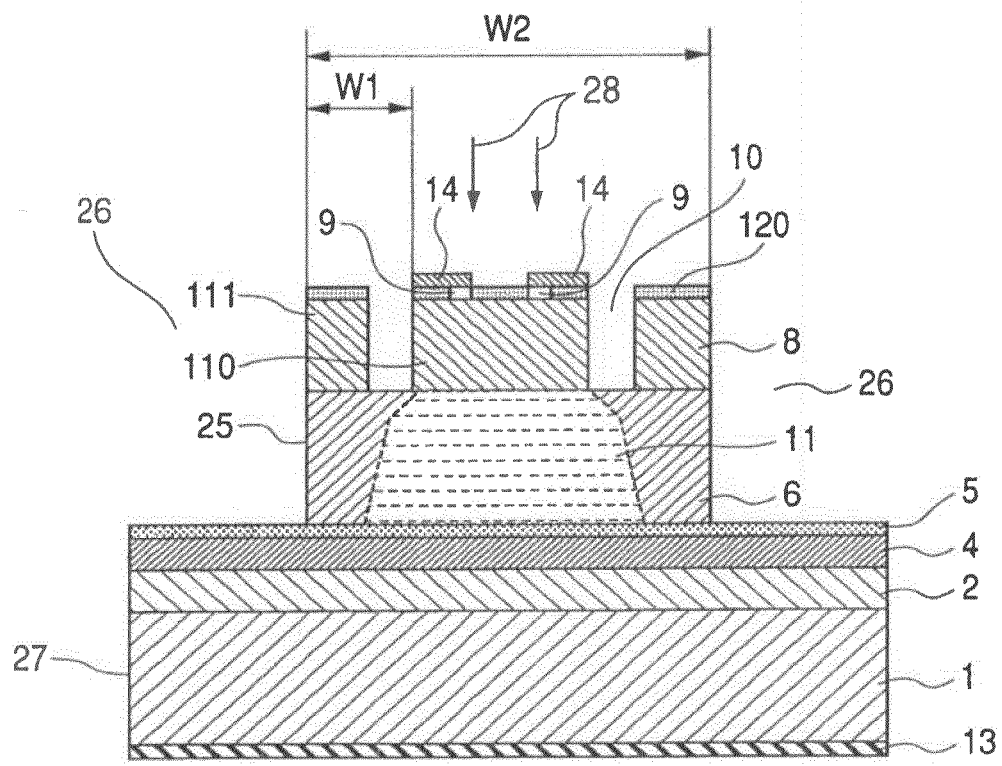
FIG. 5 is a sectional view to show the schematic structure of an avalanche photodiode according to a third embodiment of the invention.

FIG. 5 is a sectional view to show a schematic structure of an avalanche photodiode according to a third embodiment of the invention. In the present embodiment, in the avalanche photodiode according to the first embodiment, an outer trench 26 is further provided in the outer periphery of the inner region 110 separated by the groove 10 and by removing up to the light absorption layer 6, for example, so that a circular region is left about 100 μm in diameter to form the side face 25.

In the present embodiment, since the avalanche photodiode has the groove 10 formed therein, a depletion region 11 is formed right under the inner region 110. The dark current occurs mainly from the light absorption layer 6 and flows through the depletion region 11 and along the side face of the element. Accordingly, when the outer trench 26 is provided in the periphery of the light absorption layer 6 surrounding the depletion region 11, it is possible to shut off the path of the dark current, thereby decreasing the dark current. Considering spread of the depletion region 11, a width (W1 in FIG. 5) from the outside of the inner region 110 to the side face 25 may be nm order, but long-term characteristics thereof can be kept as it becomes larger. Accordingly, the width may be 5 μm or more, preferably 10 μm or more, and more preferably 30 μm or more.

On the other hand, when a width (W2 in FIG. 5) or a diameter of the light absorption layer 6 in the outer trench 26 is made small, the electric field strength of the side face 25 increases and the long-term reliability is also lowered. Therefore, preferably the width or the diameter of the light absorption layer 6 left at the forming the outer trench 26 is set to about 50 to about 200 μm. The shape of the light absorption layer 6 is not limited; it may be left like a circle or an ellipse or may be polygonal such as quadrangular or pentagonal. When it is polygonal, preferably each corner is rounded because electric field concentration in the corner can be prevented. In addition, when a plurality of outer trenches 26 are provided, the dark current is suppressed from occurring in the outer trench 26 on the inside; and scratch and chip are prevented from occurring at the end of element outer trench (not shown) on the outside, thereby preventing physical damage.

The outer trench 26 may be formed in the same manner as the manner for forming the above-described groove 10. To selectively etch an InP base material, a hydrochloric acid base solution such as a hydrochloric acid/phosphoric acid mix solution may be used. To selectively etch an AlGaInAs base material or a GaInAsP base material, an organic acid base solution such as organic acid (citric acid, tartaric acid, etc.)/ hydrogen peroxide water mix solution or a nitric acid base solution may be used. If Br base solution such as HBr/hydrogen peroxide water, Br/methanol, and the like small in selective etching property or the like is used in combination with them, it is possible to accomplish any desired side face removal.

The side face 25 may be provided with a protective film 12 (not shown) formed using organic materials such as SiNx and SiOx. The protective film 12 is provided, whereby oxidation and moisture absorption can be prevented, occurrence of a dark current can be suppressed, and further long-term reliability can be obtained.

In at least one of the side wall of the groove 10 and the side wall of the outer trench 26, semiconductor crystal may be re-grown by MO-CVD or the like to serve as the protective film 12. In this case, as the semiconductor crystal serving as the protective film 12, crystal having low-conductive i type or crystal having a semi-insulating property and a large band gap may be used, for example, InP, AlInAs, etc. Since the protective film 12 is formed of the semiconductor crystal, it is possible to suppress deterioration on an interface in comparison with a dielectric.

In the present embodiment, the outer trench 26 is formed up to the field relaxation layer 5 by way of example, but it may be removed up to a deeper layer than the avalanche multiplication layer 4.

In the present embodiment, the window layer 8 and the light absorption layer 6 are joined to each other by way of example, but a transition layer 7 (not shown) or an etching stopper layer 3 (not shown) may be provided between the window layer 8 and the light absorption layer 6.

The side face 25 is provided perpendicular to the substrate 1 by way of example, but it may be provided in another shape such as a trapezoid. Since it is difficult that the dark current flows due to a step provided between the light absorption layer 6 and the field relaxation layer 5, it may be partially removed.

In addition, when the field relaxation layer 5 is not necessary, the field relaxation layer 5 may be omitted and a step may be provided thereunder between the avalanche multiplication layer 4 and the light absorption layer 6.

Fourth Embodiment

Figure 6:
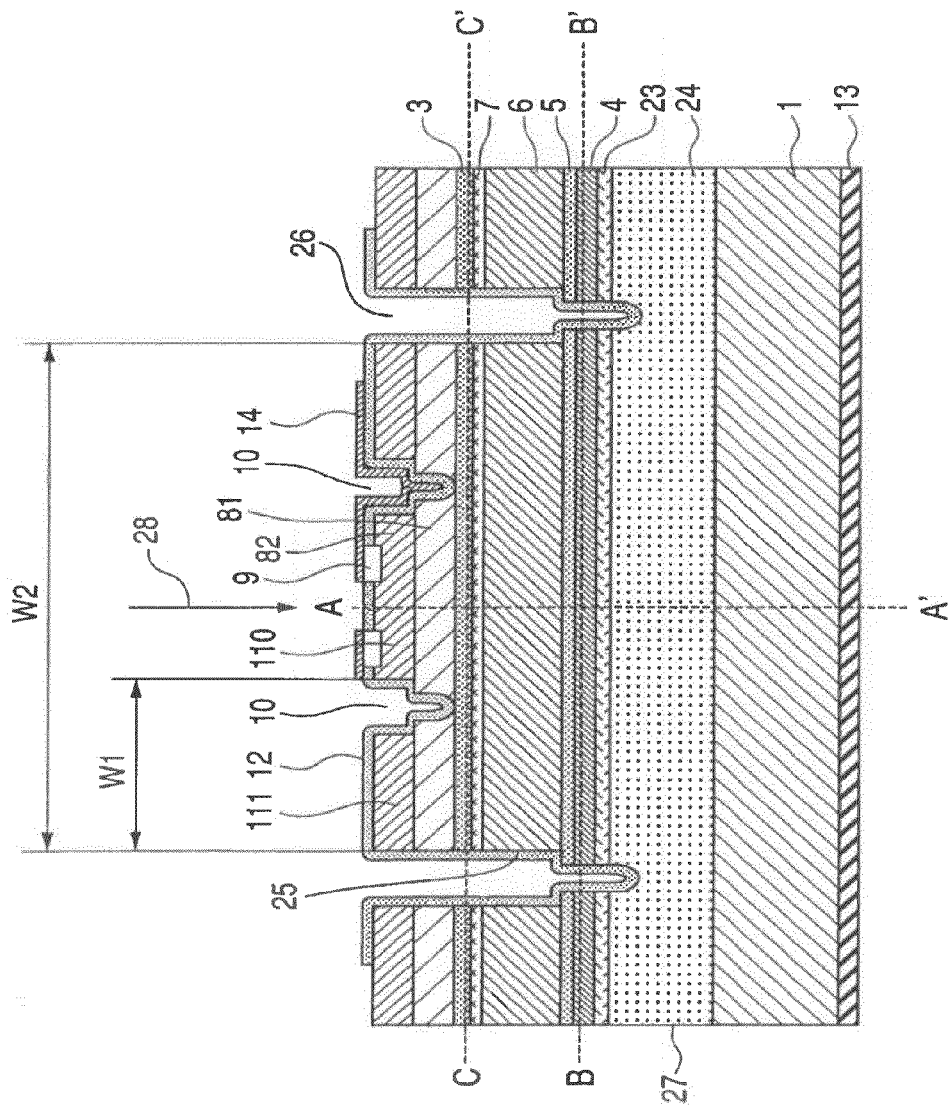
FIG. 6 is a sectional view to show the schematic structure of an avalanche photodiode according to a fourth embodiment of the invention.
Figure 7:
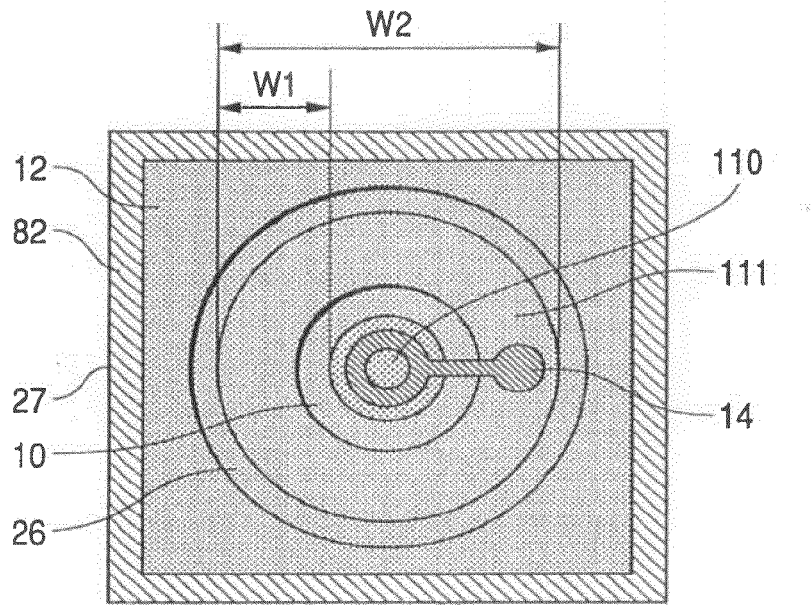
FIG. 7 is a top view to show the schematic structure of an avalanche photodiode according to a fourth embodiment of the invention.

FIG. 6 is a sectional view to show a schematic structure of an avalanche photodiode according to a fourth embodiment of the invention, and FIG. 7 is a top view thereof. In the present embodiment, as the first semiconductor layer 2 formed on the substrate 1 at the time of forming a plurality of semiconductor layers in the same manner as the first embodiment, an n type low refractive index layer such as InP or AlInAs at a carrier density of about 0.1 to $2 \times 10^{19}$ cm$^{-3}$ and a high refractive index layer such as GaInAs, GaInAsP, or AlGaInAs are set as a pair. There is used a layer obtained by depositing 8 to 20 pairs and depositing a ¼ wavelength distribution Bragg reflection layer 23 and a reflection adjustment layer 24 formed of n type InP or AlInAs. In this case, the reflection adjustment layer 24 adjusts a phase of light between the light absorption layer 6 and the reflection layer 23, and increases reflectance of the light, which passes through the light absorption layer 6, in the reflection layer 23.

The second semiconductor layer (window layer) 8 is formed of two layers of a first window layer 81 formed of p type AlInAs grown to a thickness of about 0.1 to 0.3 µm at a carrier density of about 0.1 to $2 \times 10^{19}$ cm$^{-3}$ and a second window layer 82 formed of p type InP grown to a thickness of about 0.4 to 1.0 µm.

The first window layer 81 has a larger width than that of the second window layer 82 with a gap of about 2 µm width between the first window layer 81 and the second window layer 82.

As a hole transition layer 7, 3 to 9 layers of i type GaInAsP or AlGaInAs are deposited each about 0.03 µm between the light absorption layer 6 and the first window layer 81, gradually increasing band gap energies.

As an etching stopper layer 3, i type InP layer is provided by about 0.01 to 0.05 µm.

A groove 10 is provided for separation between the inner region 110 and the outer region 111, and the groove 10 is formed to generate a difference in width of about 2 µm on one side between the first window layer 81 and the second window layer 82. A part of the outer region 111 is removed up to the reflection layer 23 to provide an outer trench 26 for forming a side face 25, and a field relaxation layer 5 is formed to protrude from the side face 25 by about 5 µm.

A protective film 12 is provided on the surface of the element.

In this case, a width W1 in FIGS. 6 and 7, that is, a distance from the outside of the inner region 110 to the side face 25 is about 80 µm. A width W2, that is, a width of the light absorption layer 6 in the outer trench 26 is about 200 µm.

In the present embodiment, since a layer formed by depositing ¼ wavelength distribution Bragg reflection layer 23 and the reflection adjustment layer 24 is formed as the first semiconductor layer 2, it is possible to reflect some light, which is not absorbed by the light absorption layer 6 and passes therethrough, to the light absorption layer 6 again. Therefore, it is possible to more increase the amount of light absorption in the light absorption layer 6 and thus it is possible to increase light sensitivity of the avalanche photodiode.

In addition, since the transition layer 7 is provided between the light absorption layer 6 and the first window layer 81, the discontinuous amount of the valence band between the light absorption layer 6 and the first window layer 81 is suppressed and pile-up of holes at a hetero interface can be prevented. Therefore, higher-speed light response can be realized from low multiplication factor.

Further, since the etching stopper layer 3 is provided between the light absorption layer 6 and the first window layer 81, it is possible to reliably etch the first window layer 81 by the groove 10.

Since the window layer 8 is formed of the first window layer 81 (upper portion) having low mobility and the second window layer 82 (lower portion) having high mobility, the second window layer 82 can be made thin. Therefore, it is possible to more decrease resistance than a case where only window layers having low mobility are provided.

Moreover, since the first window layer 81 has a lager width than that of the second window layer 82, resistance of the outer periphery of the second window layer 82 in the inner region 110 can be more increased than that of the center thereof. Therefore, it is possible to prevent the tunnel dark current from flowing in the outer periphery. Also, it is possible to prevent breakdown.

In addition, since the light absorption layer 6 is removed by the outer trench 26, it is possible to prevent, in the outer region 111 surrounded by the outer trench 26, current generated in the light absorption layer 6 from flowing through the avalanche multiplication layer 4 to the reflection layer 23 or the reflection adjustment layer 24 as a path of the side face 25. Therefore, it is possible to reduce the dark current.

Further, since a step is provided in the groove 10, it is possible to prevent the protective film 12 or the p electrode 14 provided on the top surface of the element from breaking down on the side wall of the groove. Therefore, it is possible to improve reliability.

In the same manner, since a state is provided in the outer trench 26, it is possible to shut off the dark current path and to prevent the protective film 12 from breaking down on the side wall of the outer trench. Therefore, it is possible to improve reliability.

Since the outer trench 26 is provide in a part of the outer region 111 to form the side face 25 and the outmost region is left, it is possible to suppress the dark current and to secure the strength of the element.

Figure 8:
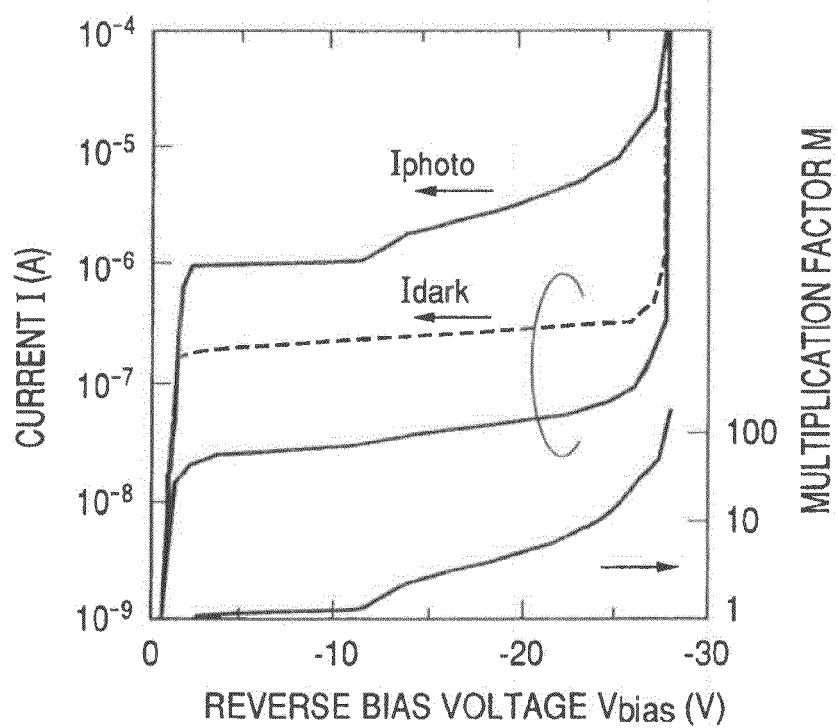
FIG. 8 is a characteristic drawing to show the relationships among current, multiplication factor M, and reverse bias voltage about the avalanche photodiode according to the fourth embodiment of the invention.

FIG. 8 is a characteristic diagram to show a relation among current, multiplication factor M, and reverse bias voltage in the avalanche photodiode according to the present embodiment. The dashed line in the figure indicates the dark current characteristic of the avalanche photodiode with element separation by providing the groove 10 and simply executing cleavage without providing the outer trench 26. The dark current (Idark in the figure) independent of the reverse bias voltage is a generated dark current from the light absorption layer 6 and in the configuration of simple cleavage, the generated dark current flows via a cleavage plane, and thus the dark current becomes $10^{-7}$ A level (Idark dashed line in the figure). In comparison with this, in the avalanche photodiode of the present embodiment, the path of the generated dark current can be shut off from the light absorption layer 6, so that the dark current can be decreased to $10^{-8}$ A level (Idark solid line in the figure). In addition, it is possible to obtain the high multiplication factor of fifty times or more.

In the present embodiment, the groove 10 is provided with the step and the first window layer 81 has a larger width than that of the second window layer 82 by way of example, and the outer trench 26 is provided with the step by way of example, but both examples have an advantage of reducing the dark current. Accordingly, any one of both may be used.

In addition, in the present embodiment, the reflection layer 23 and the reflection adjustment layer 24 are deposited as the first semiconductor layer 2 by way of example, the transition layer 7 is provided between the light absorption layer 6 and the first window layer 81 by way of example, and the etching stopper layer 3 is provided between the light absorption layer 6 and the first window layer 81 by way of example, but all the examples have an advantage of improving the characteristics of the avalanche photodiode. Accordingly, any one of them or combination of them may be used.

The reflection layer 23 and the reflection adjustment layer 24 are deposited as the first semiconductor layer 2 by way of example, but the first semiconductor layer 2 maybe formed of a part of the substrate 1 and another layer may be added.

In the present embodiment, the transition layer 7 and the etching stopper layer 3 are formed of i type as the hole transition layer by way of example, but a semi-insulating type or a low conduction type (preferably, n type) at a carrier density of $5\times10^{15}$ cm$^{-3}$ or less may be used.

The etching stopper layer 3 is formed of InP and the first window layer 81 coming into contact with the etching stopper layer 3 is formed of AlInAs, but the other materials may be used if the combination of the materials is suitable to selectively execute the etching. For example, the etching stopper layer 3 may be formed of AlInAs and the first window layer 81 may be formed of InP. 4-element based semiconductor may be used.

Further, a third semiconductor layer 15 with a larger band gap than light absorption layer 6 may be provided between the first window layer 81 and the light absorption layer 6.

Moreover, the first layer 81 is configured to have a larger width than that of the second window layer 82, but both layers may have the same width.

In addition, the whole second semiconductor layer 8 in the outer region 111 may be removed by the groove 10.

The outer trench 26 is provided with the step, but the outer trench 26 may be formed in a straight shape. Further, the periphery of the outer region 111 may be provided with a second outer trench. Accordingly, it is possible to prevent physical damage, which may be caused in the vicinity of the cleavage plane at the time of handling the element, by the second outer trench.

The outer trench 26 may extend to the cleavage plane 27.

Preferably, the outer trench 26 may be formed to reach the reflection layer 23 or the reflection adjustment layer 24 (first semiconductor layer 2). When the bottom portion of the outer trench 26 is on the n type InP layer, the n electrode 13 can be provided in this portion and the p electrode 14 and the n electrode 13 are on the same plane. Therefore, it is possible to simplify the process, which is preferable. When the lower portion thereof is on the n type GaInAs layer, contact resistance decreases, which is more preferable.

Fifth Embodiment

Figure 9:
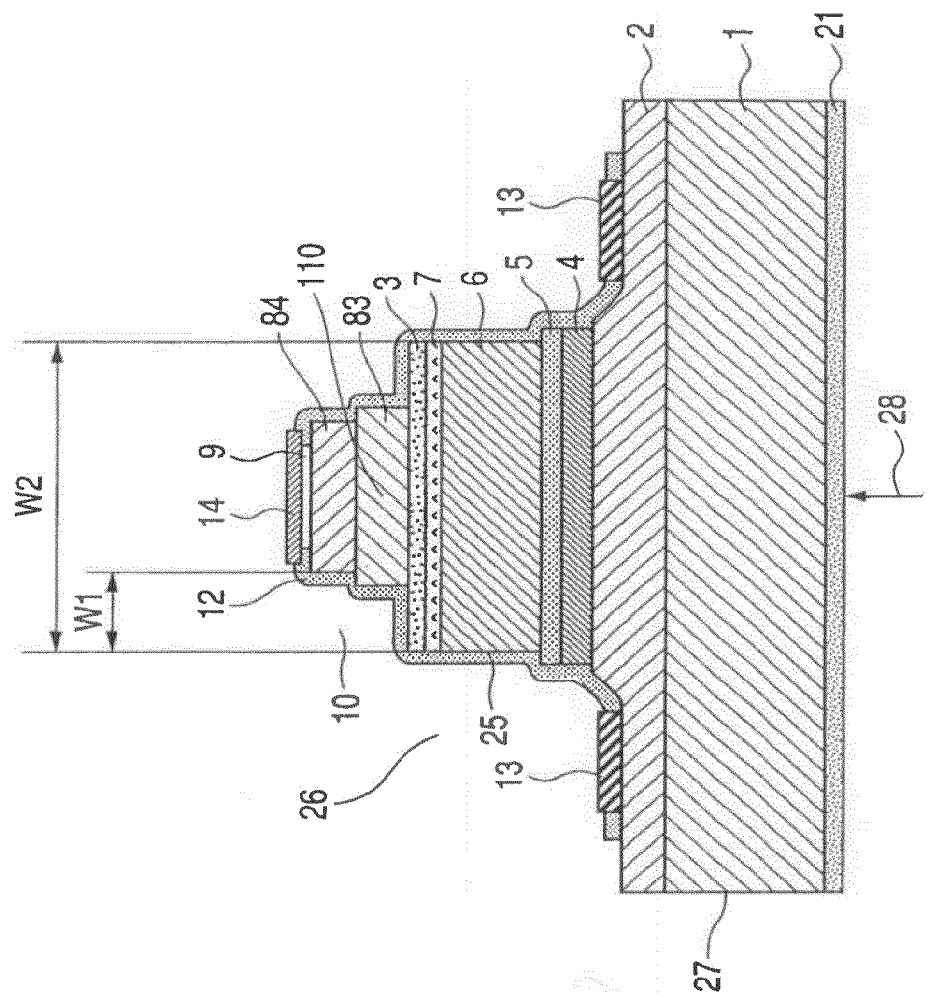
FIG. 9 is a sectional view to show the schematic structure of an avalanche photodiode according to a fifth embodiment of the invention.

FIG. 9 is a sectional view to show a schematic structure of an avalanche photodiode according to a fifth embodiment of the invention. In the present embodiment, an n type or Fe-doped high optical-transparency semi-insulating substrate is used as the substrate 1, and light 28 is made incident from the substrate 1 side. As a depositing method of the semiconductor layer, for example, on a semi-insulating InP substrate 1, n type InP or AlInAs is deposited at a carrier density 0.1 to $2\times10^{19}$ cm$^{-3}$ with a thickness of 0.1 to 1.5 μm as a first semiconductor layer 2, i type AlInAs is deposited with a thickness of 0.15 to 0.4 μm as the avalanche multiplication 4, p type InP or AlInAs is deposited at a carrier density of 0.3 to $1\times10^{18}$ cm$^{-3}$ with a thickness of 0.03 to 0.1 μm as a field relaxation layer 5, and GaInAs is deposited at a carrier density of $5\times10^{15}$ cm$^{-3}$ or less with a thickness of 1 to 2.5 μm as a light absorption layer 6. Then, 3 or 9 layers of i type GaInAsP or AlGaInAs having a large band gap energy are sequentially deposited with a thickness of 0.01 to 0.03 μm/layer as a transition layer 7, i type InP is grown with a thickness of 0.01 to 0.05 μm as an etching stopper layer 3, p type AlInAs (first cap layer 83) is grown at a carrier density of 0.1 to $2\times10^{19}$ cm$^{-3}$ as a second semiconductor layer 8 (serving as a cap layer), InP (second cap layer 84) is grown with a thickness of 0.3 to 1.0 μm, and p type GaInAs is grown with a thickness of 0.1 to 0.5 μm as a contact layer 9, sequentially.

Then, a groove 10 is formed, the contact layer 9 in the inner region 110 is removed by leaving it in a circular shape, an outer trench 26 is formed up to the first semiconductor layer 2 in a longitudinal direction (it is preferable to perform the removal up to a portion where the n type InP appears) and up to the cleavage plane 27 in a width direction.

Then, a protective film 12 is formed of SiNx, an n electrode 13 is formed on a portion excluding the protective film 12 on the first semiconductor layer 2 in the lower portion of the outer trench 26, and a p electrode 14 is formed on a portion excluding the protective film 12 above the contact layer 9. Grinding and etching are performed on a surface of the substrate 1 opposite to a surface thereof on which the semiconductor layers are deposited, a reflection prevention film 21 is formed of SiNx, and a sinter treatment is performed thereon. Cleavage separation of the wafer-like substrate 1 is performed to form an element with a size of 300 μm×300 μm having a cleavage plane 27.

Since the avalanche photodiode according to the present embodiment is formed in the above-described manner, the light 28 is made incident from the substrate 1 side, the light passing through the light absorption layer 6 is reflected by the p electrode 14, and the light is absorbed again by the light absorption layer 6. In addition, since the n electrode 13 and the p electrode 14 are provided on the same plane side of the substrate 1, a flip chip mounting is applicable. In the back-surface incident type according to the present embodiment, it is possible to make the area of the inner region 110 become smaller than that of the front-surface incident type according to the first to third embodiments. Therefore, it is possible to reduce the volume of the element and to perform a high-speed operation. Moreover, since the reflection of the electrode 14 is applicable, it is possible to obtain reliable sensitivity without the reflection layer 23.

In the present embodiment, the groove 10 and the outer trench 26 are continuously formed to prevent the protective layer 12 from cutoff by way of example, but the back-surface type may be produced in the same manner as a configuration of only the groove 10 or a configuration of the groove 10 and the outer trench 26 that are not continuously formed, as shown in the first to fourth embodiments.

Sixth Embodiment

Figure 10:
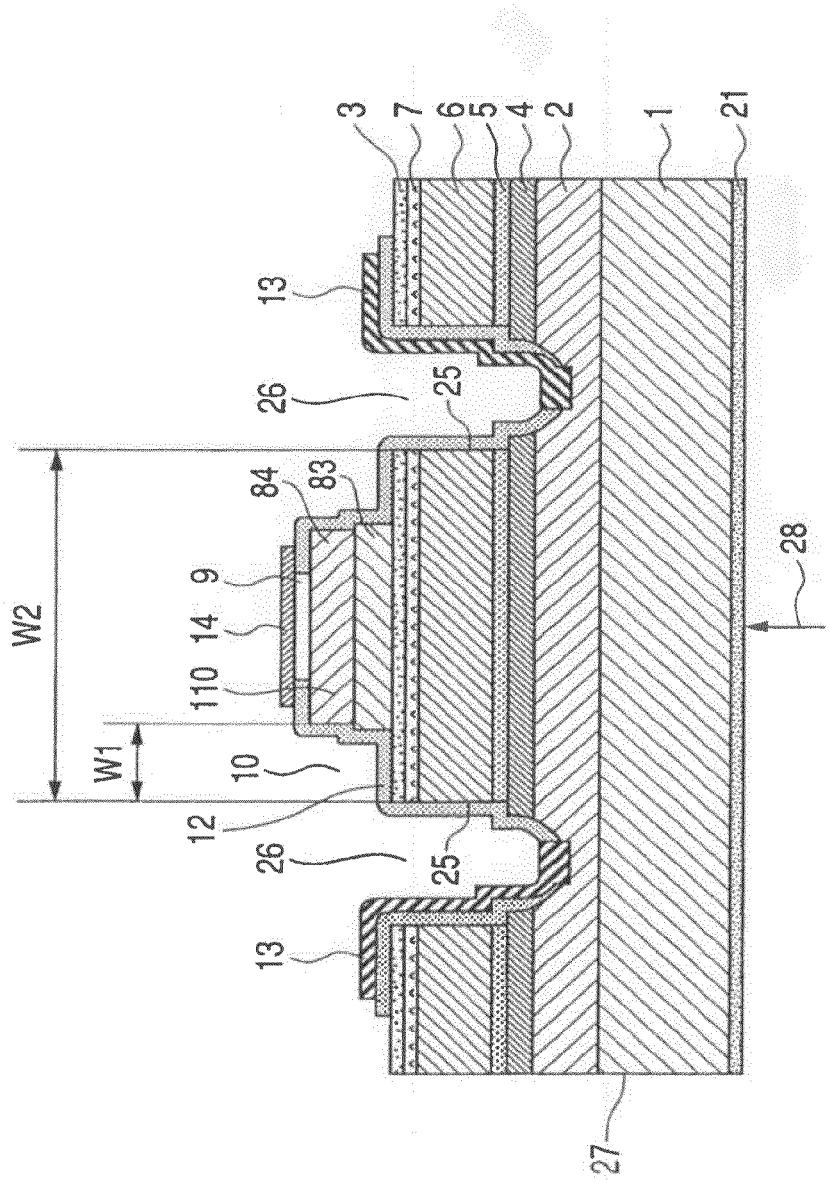
FIG. 10 is a sectional view to show the schematic structure of an avalanche photodiode according to a sixth embodiment of the invention.

FIG. 10 is a sectional view to show a schematic structure of an avalanche photodiode according to a sixth embodiment of the invention. In the present embodiment, a plurality of semiconductor layers are formed in the same manner as the fifth embodiment. However, the outer trench 26 is formed to extend from the groove 10, the outer region 111 in the periphery thereof is removed again up to the etching stopper layer 3, and the n electrode 13 is provided in the outer trench 26 and on the protective film 12 formed on the etching stopper layer 3.

According to this configuration, since the n electrode 13 is provided on the protective film 12, adhesion of the n electrode 13 is improved and thus it is possible to prevent it from peeling off. In addition, since the inner region 110 does not have a protruding shape, it is possible to prevent damage caused by physical contact to the inner region 110. Further, in a case where the substrate 1 is grinded to attach another substrate to the opposite surface of the substrate 1, it is possible to disperse pressure applied to the opposite surface of the substrate 1. Therefore, it is possible to improve strength and to prevent damage.

Seventh Embodiment

Figure 11:
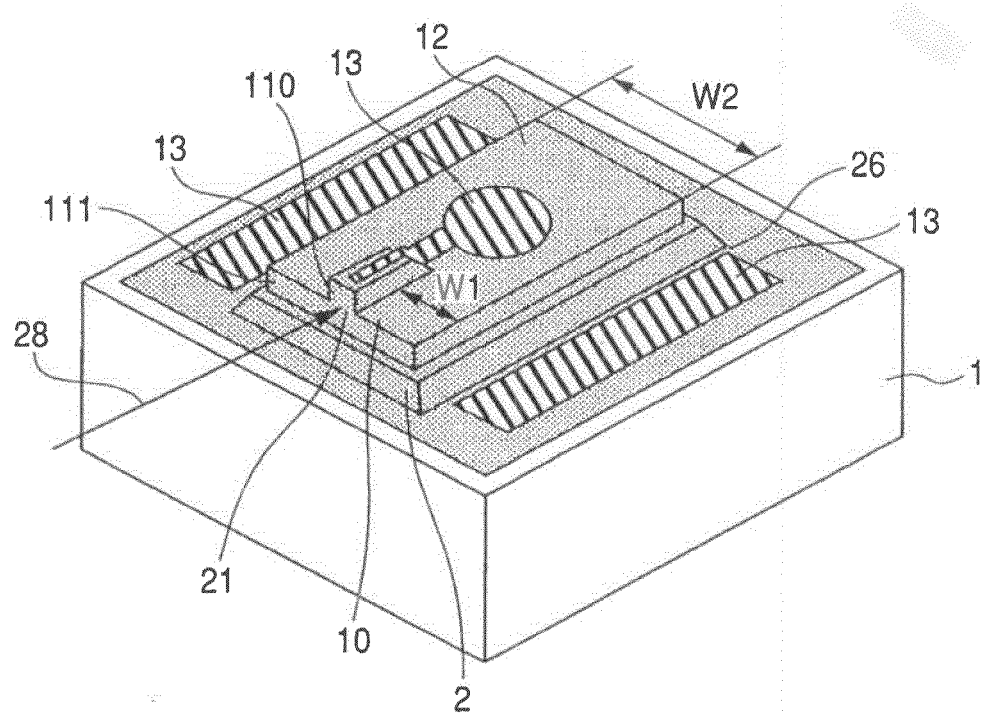
FIG. 11 is a perspective view to show the schematic structure of an avalanche photodiode according to a seventh embodiment of the invention.

FIG. 11 is a perspective view to show a schematic structure of an avalanche photodiode according to a seventh embodiment of the invention. In the present embodiment, light 28 is made incident to a side face thereof. A method of depositing each semiconductor layer is the same as the fourth embodiment. However, the inner region 110 is left in a rectangular shape and is removed up to the etching stopper layer 3 by the groove 10. A clad is formed by removing the outer region 111 up to the upper portion of the first semiconductor layer 2 by the outer trench 26 in a rectangular shape so as to surround the inner region 110 left in the rectangular shape. Then, a contact layer 9 is provided on the window layer 8 in the inner region 110, and a p electrode 14 is formed on the protective film 12 provided on the etching stopper layer 3 from the contact layer 9 through a wall portion of the groove 10. A light incidence face is the side wall of the inner region 110. The groove 10 and the outer trench 26 are continuously removed up to the second semiconductor layer (preferably, up to a portion where the n type InP appears) in a depth direction and up to cleavage plane 27 in a width direction. Then, n electrode 13 is provided on the protective film 12 on the upper portion of the first semiconductor layer 2, and an element is mounted by the use of a metallic member (now shown).

Since the avalanche photodiode according to the present embodiment is configured as described above, the avalanche photodiode may have a waveguide structure using the light absorption layer 6 as a core. When the light 28 is made incident to the side wall of the inner region 110, the light is absorbed during a waveguide transmission of the light. Therefore, it is possible to make the light absorption layer 6 thin, and to make the area of pn junction small. Since it is possible to reduce a traveling time of electrons or holes and to reduce a volume, it is possible to perform a high-speed operation.

In the present embodiment, the avalanche photodiode is used as a strip-loaded type waveguide by way of example, but a slab type waveguide and a reclaimed type waveguide may be applicable. As a crystal configuration, a clad layer may be provided on both upper and lower portions or on any one of both, between the first semiconductor layer 2 and the multiplication layer 4 or on the light absorption layer 6, so as to tighten optical confinement.

In the first to seventh embodiments, the n type is used as the first conduction type, the p type is used as the second conduction type, the n electrode is used as the first electrode, and the p electrode is used as the second electrode by way of example, but the p type may be used as the first conduction type, the n type may be used as the second conduction type, the p electrode may be used as the first electrode, and the n electrode may be used as the second electrode.

The invention claimed is:

1. An avalanche photodiode comprising:
a first electrode; and
a substrate including a first semiconductor layer made of a first conduction type electrically connected to the first electrode,
wherein at least an avalanche multiplication layer of an i-type, a field relaxation layer of a second conduction type, a light absorption layer, and a second semiconductor layer made of the second conduction type with a larger band gap than the light absorption layer are deposited on the substrate in this order, the field relaxation layer extending past the light absorption layer,
wherein the second semiconductor layer is separated into an inner region and an outer region by a groove formed therein,
wherein the inner region is electrically connected to a second electrode,
wherein the outer region includes an inner part and an outer part,
wherein the outer region is provided with an outer trench to surround the inner region and the groove, the outer trench being between the inner part and the outer part of the outer region, and at least the light absorption layer is removed by the outer trench to form a side face thereof,
wherein the inner region includes a light reception region,
wherein the inner part of the outer region does not include the light reception region,
wherein the inner region and the inner part of the outer region are made of a same conduction type, and
wherein the groove extends throughout the second semiconductor layer.

2. The avalanche photodiode according to claim 1, wherein the outer trench extends toward a cleavage plane of the substrate.

3. The avalanche photodiode according to claim 1, wherein the outer trench and the groove are formed continuously.

4. The avalanche photodiode according to claim 1, wherein the second semiconductor layer in the inner region has a plurality of layers, and widths of the plurality of layers increase as they get closer to the substrate.

5. The avalanche photodiode according to claim 1, wherein the second semiconductor layer in the inner region has a plurality of layers, and mobilities of the plurality of layers decrease as they get closer to the substrate.

6. The avalanche photodiode according to claim 1, wherein a light incidence portion is any one of a front-surface incident type of a front surface of the substrate, a back-surface incident type of a back surface of the substrate, and a side-surface incident type of a side wall formed by the groove or the outer trench that surrounds the inner region and the groove.

7. The avalanche photodiode according to claim 1, wherein the outer trench extends to the field relaxation layer, without extending past the field relaxation layer.

8. The avalanche photodiode according to claim 1, wherein the light absorption layer and the field relaxation layer form a step at a junction of the light absorption layer and the field relaxation layer.

9. The avalanche photodiode according to claim 1, wherein the field relaxation layer protrudes from the side face.

* * * * *